United States Patent [19]

Barale et al.

[11] Patent Number: 5,125,359
[45] Date of Patent: Jun. 30, 1992

[54] SURFACE DEPOSITION OR SURFACE TREATMENT REACTOR

[75] Inventors: Gilbert Barale, Roquettes; Jean-Claude Izard, Verdun s/ Garonne; Francois Rizzetto, Fontenilles; Jean-Pierre Couderc, Toulouse; Christian Gachen, Toulouse; Roland Morancho, Toulouse, all of France

[73] Assignees: Institut National de Rechereche Chimique Applique; Cent. Natl. Recherche Scientifique, both of Paris, France

[21] Appl. No.: 470,830

[22] PCT Filed: Jul. 20, 1988

[86] PCT No.: PCT/FR88/00372
§ 371 Date: Jan. 26, 1990
§ 102(e) Date: Jan. 26, 1990

[87] PCT Pub. No.: WO89/01055
PCT Pub. Date: Feb. 9, 1989

[30] Foreign Application Priority Data
Jul. 27, 1987 [FR] France ................. 87 10666

[51] Int. Cl.⁵ ............................. H01L 21/00
[52] U.S. Cl. ................. 118/725; 118/728; 118/730
[58] Field of Search ............... 118/725, 730, 728, 715

[56] References Cited

U.S. PATENT DOCUMENTS

| | | | |
|---|---|---|---|
| 3,460,510 | 8/1969 | Currin | 118/725 |
| 3,796,182 | 3/1974 | Rosler | 118/725 |
| 4,430,959 | 2/1984 | Ebata et al. | 118/725 |
| 4,484,538 | 11/1984 | Sarkozy et al. | 118/728 |
| 4,524,719 | 6/1985 | Campbell et al. | 118/725 |
| 4,545,327 | 10/1985 | Campbell et al. | 118/725 |
| 4,566,839 | 1/1986 | Butler | 118/728 |
| 4,579,080 | 4/1986 | Martin et al. | 118/725 |
| 4,612,207 | 9/1986 | Jansen | 118/730 |
| 4,823,735 | 4/1989 | Pichel et al. | 118/728 |
| 4,926,793 | 5/1990 | Arima et al. | 118/725 |

Primary Examiner—Richard Bueker
Assistant Examiner—George A. Goudreau
Attorney, Agent, or Firm—Harold H. Dutton, Jr.

[57] ABSTRACT

A surface deposition or surface treatment reactor, in particular for chemical vapor deposition, has an annular reaction chamber ($C_R$) delimited by two tubular walls (1, 2), in particular of quartz. A first hearing unit is arranged inside the tubular wall (1) and a second heating unit is arranged around the outer tubular wall (2). Said units are controlled by heat-regulating means in order to ensure a predetermined longitudinal temperature profile in the reaction chamber ($C_R$). The gas phase is distributed at a longitudinal end of the chamber ($C_R$) through distribution ducts (18) and removed by suction at the other end through pumping ducts (20). The substrates (S), which may be very numerous, are swept simultaneously by the gas phase and the perfect control of the temperature distribution and of the flow makes it possible to obtain a uniform treatment of the desired type which is identical for all the substrates.

15 Claims, 7 Drawing Sheets

SURFACE DEPOSITION OR SURFACE TREATMENT REACTOR

This invention relates to a surface deposition or surface treatment reactor, permitting coating of substrates with thin films, or carrying out a surface treatment thereon. It provides in particular a chemical vapor deposition reactor ("chemical vapor deposition: CVD") and may in particular be applied to the production of electronic components or integrated circuits: coating of circuit boards with thin film conductors, semi-conductors or insulators (for example the formation or doping of epitaxial, polycrystalline or amorphous films of materials such as silicon, germanium, or gallium arsenide . . . ). The reactor according to the invention may also be used for carrying out nitriding, oxidizing or other surface treatments on surfaces of substrates or even for carrying out deposition by cathode sputtering . . . .

For example, the chemical vapor deposition process is used presently for depositing various materials on substrates in numerous applications: electronic fields as mentioned above, mechanical fields for producing corrosion resistant coatings or abrasion resistant coatings or in the nuclear field. This process which generally implies a thermal decomposition, a chemical oxidation or a chemical reduction consists in causing a gas phase to circulate at low pressure in contact with the substrates to be coated at a precise temperature appropriate to the operation (most frequently between 400° C. and 800° C.); this gas phase constitutes a vector gas containing the reactive components.

The characteristics of the deposits obtained (composition, uniformity . . . ) are influenced by several factors and in particular by the distribution of the temperature and by the flow characteristics at the level of the substrates. The control of the temperature is generally a fundamental condition for improving the deposits achieved and, in numerous applications, a variation of several degrees is sufficient to disturb the results obtained.

For improving the profitability of the process, it is desireable to treat on each pass a large number of substrates especially in the electronic field where they are presented in the form of thin circular plates, and the conventional CVD reactors, shown for example in German patent 3,134,702, comprise an enclosure of an elongated shape in which a series of substrates are arranged side by side from one end of the enclosure, where the gas phase is introduced, to the opposite end where said gas phase is withdrawn. However, it is not possible in this type of reactor to precisely improve the coatings obtained on all of the substrates when the number becomes very great (for example over a hundred for electronic circuit boards). In effect, the substrates are swept successively by the gas flow which becomes depleted in reactive components during its passage, leading to a different treatment depending on the placement of the substrate.

To overcome the deficiency mentioned above, reactors have been conceived in which the gas phase sweeps all of the substrates simultaneously, and not successively. For example, U.S. Pat. No. 4,524,719 and European patent 0,137,702 describe a reactor in which the substrates are arranged in a reaction chamber in a vertical position parallel to the path of the CVD gas. However, the uniformity of the temperature in the reaction chamber being very difficult to control in this type of reactors, and the capacity of such reaction chamber being necessarily low, the number of substrates treated is very limited, in order to avoid gas flows in the chamber becoming completely uncontrollable and unacceptable temperature gradients appearing.

It should be noted that Japanese patent JP-A-60.184679 describes a reactor comprising two chambers constituting a first enclosure which is inserted into a second enclosure in the form of a hood: the first enclosure forms the reaction chamber and contains the substrate and the heating means; a gas distributor with several tubes is provided along the axis of the two enclosures and may be displaced axially to permit distribution of this or that gas toward the reaction chamber depending upon the coating to be produced. This reactor thus permits facilitating the production of the deposit in multiple layers but provides not solution to the problem of control of the distribution of the temperatures and the flow in the reaction chamber.

The present invention seeks to provide a new reactor for vapor phase deposition, providing a satisfactory solution to the problems described above.

In a more general manner, the invention seeks to provide a new surface deposition or surface treatment reactor for carrying out known processes involving a thermal transport and a sweeping by means of a gas phase, the object of the invention being to permit the treatment of a high number of substrates (theoretically without limit), while keeping a precise control of the distribution of the temperatures and the flow in order to obtain a treatment or deposition of a desirable type, identical for all of the substrates.

Another object is to provide a reactor which benefits from a great flexibility of use, especially for carrying out the loading and unloading of substrates.

Another object is to provide a reactor well suited to be installed in clean rooms, in particular for the production of electronic components or electronic circuits by carrying out a CVD process.

The invention extends to any reactor for surface deposition or surface treatment, and in particular in the case of a vapor phase deposition or chemical vapor phase deposition (CVD), but also physical vapor phase deposition ("Physical Vapor Deposition PVD"), these depositions being either aided or not by conventional means (plasmas, radiation . . . ).

The surface deposition or surface treatment reactor according to the invention comprises in combination:
- a first, inner tubular wall, chemically stable at high temperature, extending about a longitudinal axis (X) and defining internally a central volume,
- a second, outer tubular wall, chemically stable at high temperature, extending about the first tubular wall for defining therewith an annular reaction chamber,
- two closing walls arranged to sealingly close said annular reaction chamber at its two longitudinal extremities,
- a peripheral enclosure extending about the outer tubular wall over at least a portion of the height thereof,
- gas distribution means adapted to deliver a gas phase to the interior of the annular reaction chamber in the vicinity of one of the closing walls, called the upstream wall, said distribution means being arranged to distribute the gas phase throughout 360° in said annular chamber, suction means arranged to withdraw the gas phase after reaction in the vicinity of the opposite closing wall, called the downstream wall, in such a manner as to preserve the distribution in a ring of gas flowing on the interior of the annular reaction chamber, a first heating assembly arranged on the interior of the central volume in such a manner as to be able to transmit to the inner tubular wall a heat flow distributed over 360°, a second heating assembly arranged in the peripheral enclosure in such a manner as to transmit to the outer tubular wall a heat flow distributed over 360° thereof, heat regulating means adapted to control the first and second heating assemblies in such a manner that the heat flows transmitted through the inner and outer walls tend to assure a predetermined longitudinal temperature profile in the annular reaction chamber over a portion of the height thereof called the working portion, a substrate support of a shape adapted to be lodged in the annular reaction chamber for positionning the substrates in the working portion of said annular chamber.

Such a reactor with an annular reaction chamber permits a fine control of the temperature profile in the working zone due to an appropriate control of the first and second heating assemblies. Further, it can be easily adapted to treat a desireable high number of substrates, by a simple appropriate adjustment of the radii of the first and second annular walls, and still permitting an essentially uniform flow of the gas phase in the annular reaction chamber due to a suitable distribution of this phase by the gas distribution means.

The substrates arranged in a ring in the annular reaction chamber are arranged in a single layer or in a sufficiently limited number of layers in order that changes in the gas phase will be imperceptible between the first and the last layer swept. In practice, the number of layers will be equal to 1 in numerous applications, such that all of the substrates will be swept simultaneously or essentially simultaneously by the gas phase.

In the case of substrates constituting plates having a very slight thickness with respect to their other dimensions, they may advantageously be arranged on a support of a generally annular shape, defining on its periphery a plurality of pockets, each adapted to keep one plate in a radial position or adjacent to a radial position. For example, these circuit boards may be held individually by circular guides, fixed by cross-members to a series of movable feet. These guides, provided with slots or notches on their periphery are dimensioned to be housed in the annular reaction chamber, and hold each circuit board in their notches or slots in a radial position. In the electronic field, the small elements to be coated by CVD are often pre-positioned by lots in linear boats where they are arranged in parallel planes. In some cases, it is possible to store these boats, the substrate support then comprising a perforated annular support framework, provided about its periphery with means for positioning a plurality of the boats. Each boat is arranged tangentially in the annular reaction chamber in such a manner that its central circuit board is in a radial position, the other circuit boards being spaced by several degrees from this position.

The heating assemblies arranged one in the central space of the interior of the inner tubular wall, the other in the peripheral enclosure around the outer tubular wall, can be of any type: electric resistance or induction heating, fluidized bed heaters, etc. . . . However, it is preferred in practice to used heating assemblies of an electric type by reason of their greater ease of control by well known types of regulating means. Generally, the two heating assemblies will comprise independent active elements (electric resistance elements . . . ). However, one of these assemblies may in some cases be passive and comprise an annular reflector returning the thermal radiation toward the reaction chamber.

The heat regulating means, called upon to control the first and second heating assemblies, comprises temperature sensors, known per se, distributed on the inner tubular wall and on the outer tubular wall, and a control unit adapted to control the heating assemblies as a function of the temperature information or data from the sensors, in such a manner as to obtain the desired temperature profile in the annular reaction chamber (this profile being preliminarily stored in said control unit in the form of one or a set of predetermined temperatures).

According to a first embodiment, the gas distribution means and the suction means open into the annular reaction chamber through the opposite closure walls which close the chamber at its two extremities. These means comprise networks of conduits (a network of supply conduits or a network of suction conduits) distributed around the longitudinal axis of the reactor at the two ends thereof and connected to a primary conduit (gas phase inlet conduit or collector pump). At least one of these primary conduits is a flexible conduit in order to permit the removal of the corresponding closure wall in order to load or unload the substrates.

According to another embodiment, the gas distribution means and the aspiration means are situated on the sam side of the reactor and penetrate therein through one of its longitudinal extremities. In this case, one of the functions (distribution or aspiration) is, as before, assured by a network of conduits opening into the chamber through one of the closure walls, but the other function (aspiration or distribution) is assured through a collector which penetrates into the central volume of the side of said closure wall and is extended along this central volume for opening across a closing end of said volume opposite the other closure wall: the gas phase may thus flow in the space separating this end and this wall, between the annular reaction chamber and the collector. In this manner, in this embodiment, one of the closure walls and the corresponding longitudinal extremity of the reactor are free of all distribution and aspiration equipment, which facilitates particularly the installation of the reactor into a clean room: this longitudinal extremity will be arranged to empty into the clean room in such a manner as to permit the loading and the unloading of the substrates under these conditions of required cleanliness, while the opposite end of the reactor (provided with distribution and suction equipment) will be situated outside of the clean room in such a manner that this equipment will be arranged on the exterior thereof.

Further, one of the closure walls (the wall free of equipment in the one embodiment described above or the wall associated with the flexible conduit in the other embodiment) is preferably arranged to be movable in the longitudinal direction and supported by translation means permitting displacing it between a working position where said closure wall sealingly closes the annular reaction chamber, and a loading position where said wall is separated from the end of said chamber leaving it open. The substrate support carried by said wall is thus displaced therewith between a working position inside the annular reaction chamber and a loading position outside the chamber.

In an improved version, a rotatable annular plate is associated with said closure wall in such a manner as to be able to cause the substrate support to rotate about the longitudinal axis of the reactor, either during treatment or during the course of loading and unloading in order to automate these operations.

The invention may in particular be applied for carrying out chemical vapor phase deposition (CVD) of conductive films, semi-conductive films or insulating films for the production of electronic components or circuits. In this application, the inner tubular wall and the outer tubular wall are cylindrical walls of a refractory material of high thermal stability such as quartz, the substrate support itself also being of a refractory material of high thermal stability such as quartz.

In the case of assisted deposition, the annular reaction chamber is provided with conventional means for aiding the deposit: plasma production electrodes, radiation generator (ultraviolet, microwave) . . . .

Other characteristics, goals and advantages of the invention will become apparent from the description which follows in reference to the accompanying drawings, which show by way of non-limiting examples two embodiments; in these drawings, which form an integral part of the present description:

Figure 1:
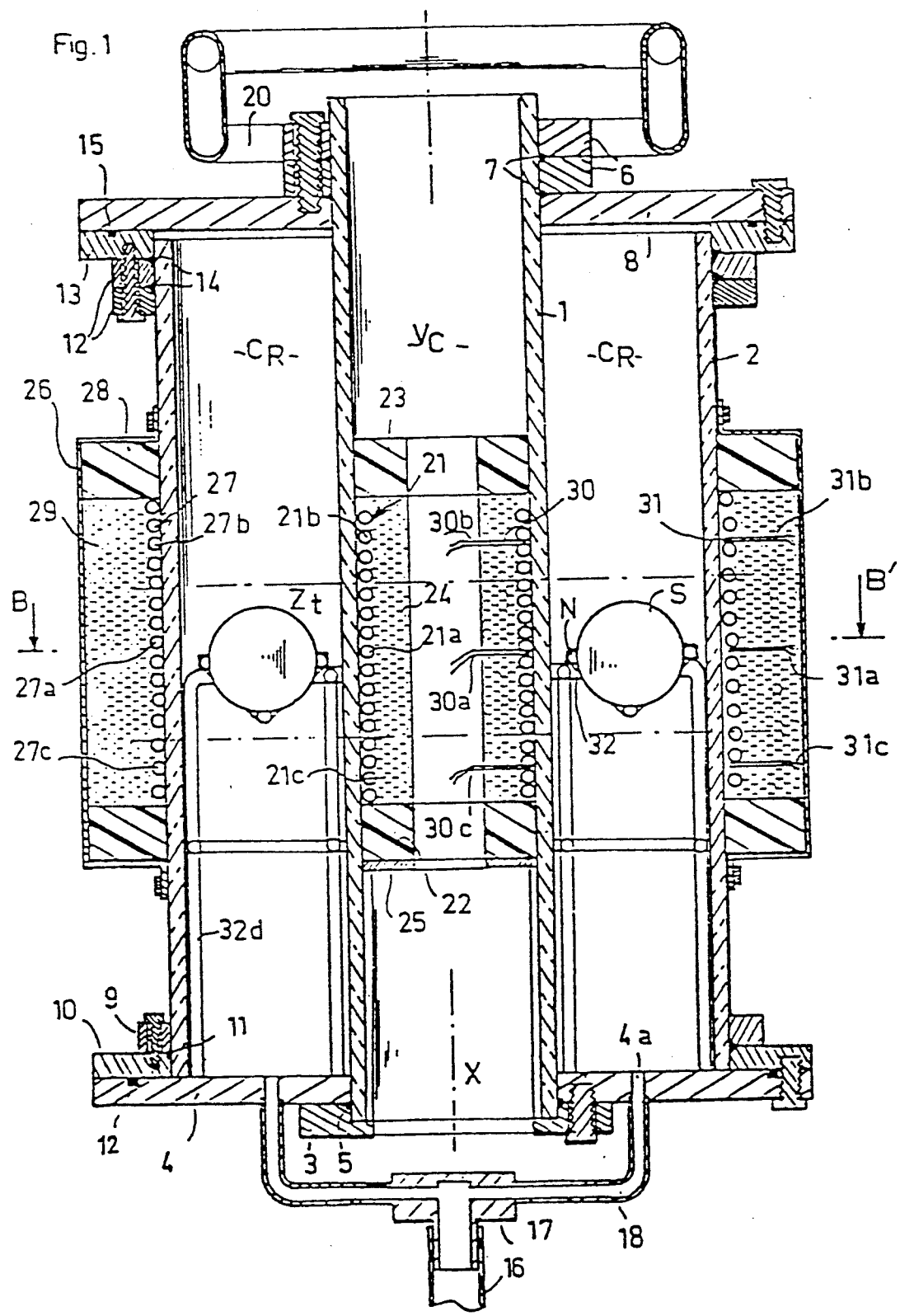
FIG. 1 is an axial cross-sectional view through a vertical plane AA' of a first embodiment of the reactor.

The chemical vapor deposition reactor shown by way of example in FIGS. 1 through 4 extends along a longitudinal vertical axis X and comprises an annular reaction chamber $C_R$ situated around and along this axis. This chamber $C_R$ is essentially defined by two cylindrical walls, inner 1 and outer 2, of quartz or similar refractory material of high thermal stability.

The inner wall defines internally a cylindrical central volume $V_C$ which extends along the axis X. This wall is supported at its lower end (cold zone of the reactor) by a steel flange 3 which is bolted beneath a closure wall 4, termed the upstream wall, closing the annular reaction chamber $C_R$ at its lower extremity; a gasket 5 assures the seal.

In the upper part (cold zone), the internal wall 1 is inserted into the flanges 6 with the interposition of gaskets or seals such as 7. These flanges are bolted to another closure wall 8, called the downstream wall, closing the annular reaction chamber $C_R$ at its upper extremity.

The outer wall 2 cooperates in an analogous manner, at the lower part and the upper part, with the annular flanges, with interposed sealing joints: in the lower part, flanges 9 and 10 guiding a seal 11, seal 12 between the upstream wall 4 and the flange 10; in the upper part, flanges 12 and 13 guiding the seals 14, seal 15 between the downstream wall 8 and the flange 13.

In a conventional manner, the flanges and closure walls may be provided with means for the circulation of a cooling fluid, avoiding any excessive heating of these cold zones.

In the embodiment described, with the upstream wall 4 is associated gas distribution means, comprising essentially a flexible inlet conduit 16 which is connected to a central junction 17 from which leaves a network of radially spaced distribution conduits 18 opposite and below the upstream wall 4. Each distribution conduit 18 is secured to the wall 4 and empties into an inlet opening such as 4a provided in said wall. The conduits 18 are equally distributed around the axis X and empty into the annular reaction chamber $C_R$ at a radial distance approximately the average of the radius of the internal wall 1 and that of the outer wall 2. In the example shown (FIG. 3), the distribution conduits 18 are six in number, angularly spaced by 60°.

With the downstream closure wall 8 is associated aspiration means comprising essentially a collector pump 19 connected to a network of aspiration conduits such as 20 arranged opposite and above the downstream wall 8. As before, the aspiration conduits 20 are connected to openings of the type provided in the downstream wall 8. These openings are distributed about the axis X for evacuating the annular reaction chamber $C_R$ approximately at the mid-radius thereof. In the example shown (FIG. 4) the aspiration conduits are four in number, opening into the chamber $C_R$ through openings angularly spaced by 90°.

In mid-volume, the central volume VC contains a first heating assembly comprising electrical resistance heaters 21 wound in coils on the interior and very close to or in contact with the internal wall 1. These resistance heaters are arranged between two insulating sleeves 22 and 23 and are arranged so as to radiate toward the wall 1, an annular layer of an insulating material 24 able to withstand high temperatures reducing losses in the radially inward direction.

This heating assembly which is slid into the central space $V_C$ along the internal wall 1 is kept in the central portion of the space $V_C$ by a ring shown at 25, provided with legs resting on the flange 3.

Around the external wall 2 is arranged a second heating assembly of a type analagous to the first, which is housed in a peripheral enclosure 26 extending over a portion of the height of the wall 2, in the median zone thereof, such that the two heating assemblies are situated at the same level. As before, this second heating assembly comprises electric resistance heaters 27 wound in coils on the exterior and very close to, or in contact with the outer wall 2, insulating sleeves 28 and an annular layer 29 of an insulating material reducing losses radially outwardly.

Each heating assembly is divided into several longitudinally juxtaposed sub-assemblies which are controlled separately by a control unit (not shown). In the example, particularly in the goal of providing a homogeneous temperature in a work zone $Z_t$ in the chamber $C_R$ (defined by two dashed lines in FIG. 1), each heating assembly is divided into three juxtaposed sub-assemblies, comprising one of the intermediate resistive coils such as 21a or 27a situated approximately at the level of the work portion $Z_t$, and the two other marginal coils such as 21b or 27b above the first, and 21c or 27c below the first.

Temperature sensors 30 and 31 are associated with the heating assembly and arranged on the surface of the internal wall 1 and on that of the external wall 2 in order to furnish temperature information. For each heating assembly, several sensors 30 or 31 are provided, positioned at the level of the various heating sub-assemblies: for example, sensors 30a or 31a associated with coils 21a or 27a; sensors 30b or 31b associated with coils 21b or 27c; sensors 30c or 31c associated with coils 21c or 27c. It will be understood that at each level, several sensors may be arranged around the coils, so that the information used would be an average reading.

The sensors 30 and 31 deliver their temperature signals to the control unit mentioned above which comprises conventional control circuits able to regulate the flow of electricity to the various heating sub-assemblies as a function of the temperature data from the corresponding sensors.

In the example shown where a homogeneous temperature is sought in the work portion $Z_t$, the control unit is adapted to increase the heat flow provided by each heating sub-assembly in case of a negative variation between the sensed temperature at the level of said sub-assembly and a desired temperature, identical for all of the sub-assemblies, and for reducing this flow in the opposite case.

It will be understood that the control unit is, in each application, programmed as a function of the desired temperature profile. In particular, it is possible to divide the heating assemblies 21 and 27 into a greater number of sub-assemblies, and to impose upon each of them its own intended temperature, the control adjusting the feed to the corresponding coils in order to reduce for each sub-assembly the variations between the detected temperature and its desired temperature.

The annular shape of the reaction chamber $C_R$, the presence of two heating assemblies, inner 21 and outer 29, and their extension along the longitudinal axis X, with, in some cases, separation into independently controlled subassemblies, permit controlling the profile of the temperature in the work portion of the chamber $C_R$ with remarkable conditions of precision.

The substrates to be coated, in the example thin circular plates S, are positioned in this work portion by means of a support 32 of a generally annular shape. This support rests on the closure wall 4 and may be removed upon removal of this wall.

In the example, the support 32 is made of quartz and comprises an annular framework adapted to permit the placement of several boats N of a conventional type, themselves made of quartz, which hold the plates S (typically 25 plates per boat). Each boat comes to rest on the upper cross-members 32a of the framework 32 which connect the circular members 32b and 32c, mounted on the legs 32d.

Figure 2:
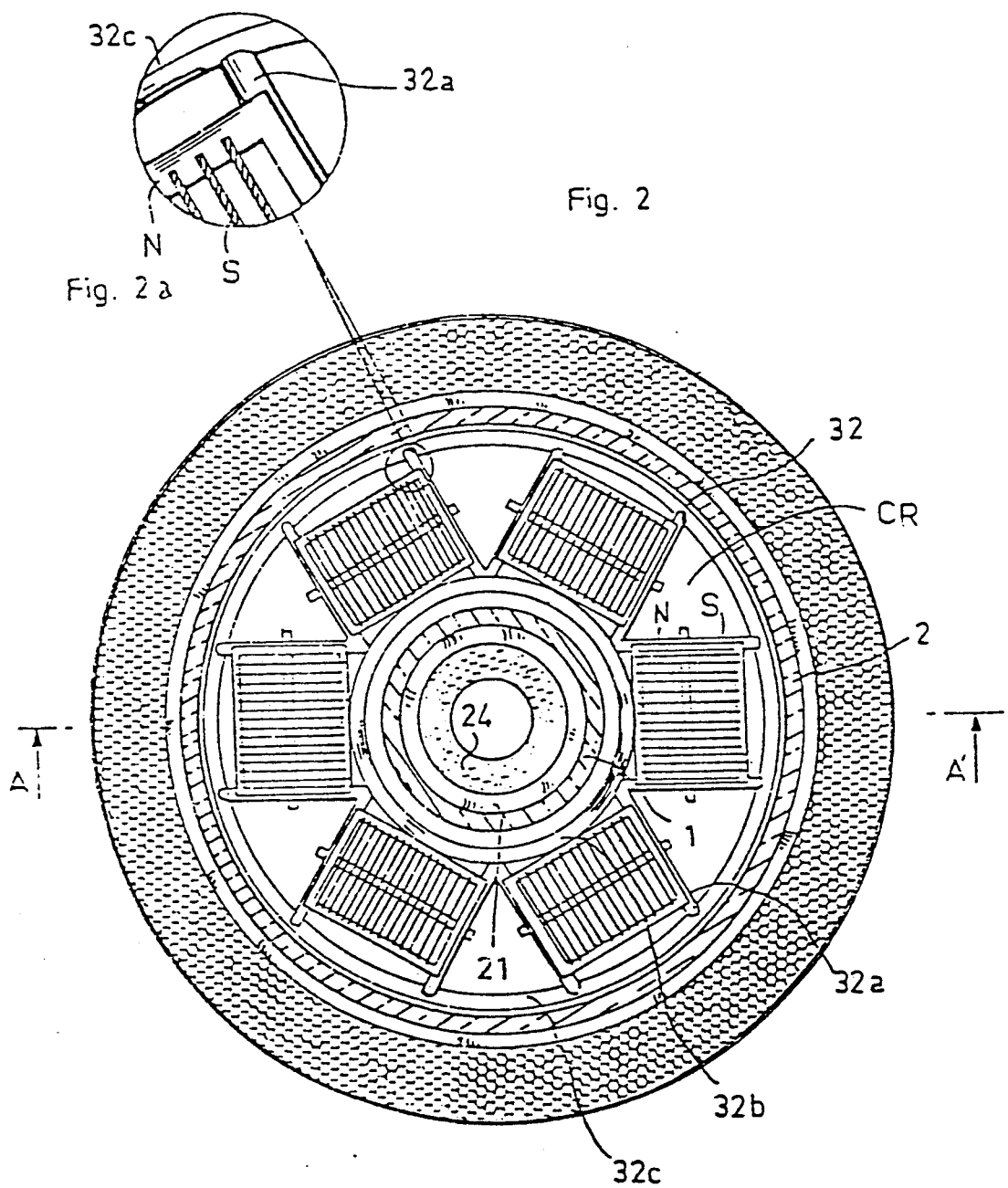
FIG. 2 is a transverse cross-sectional view through a horizontal plane BB'.
Figure 3:
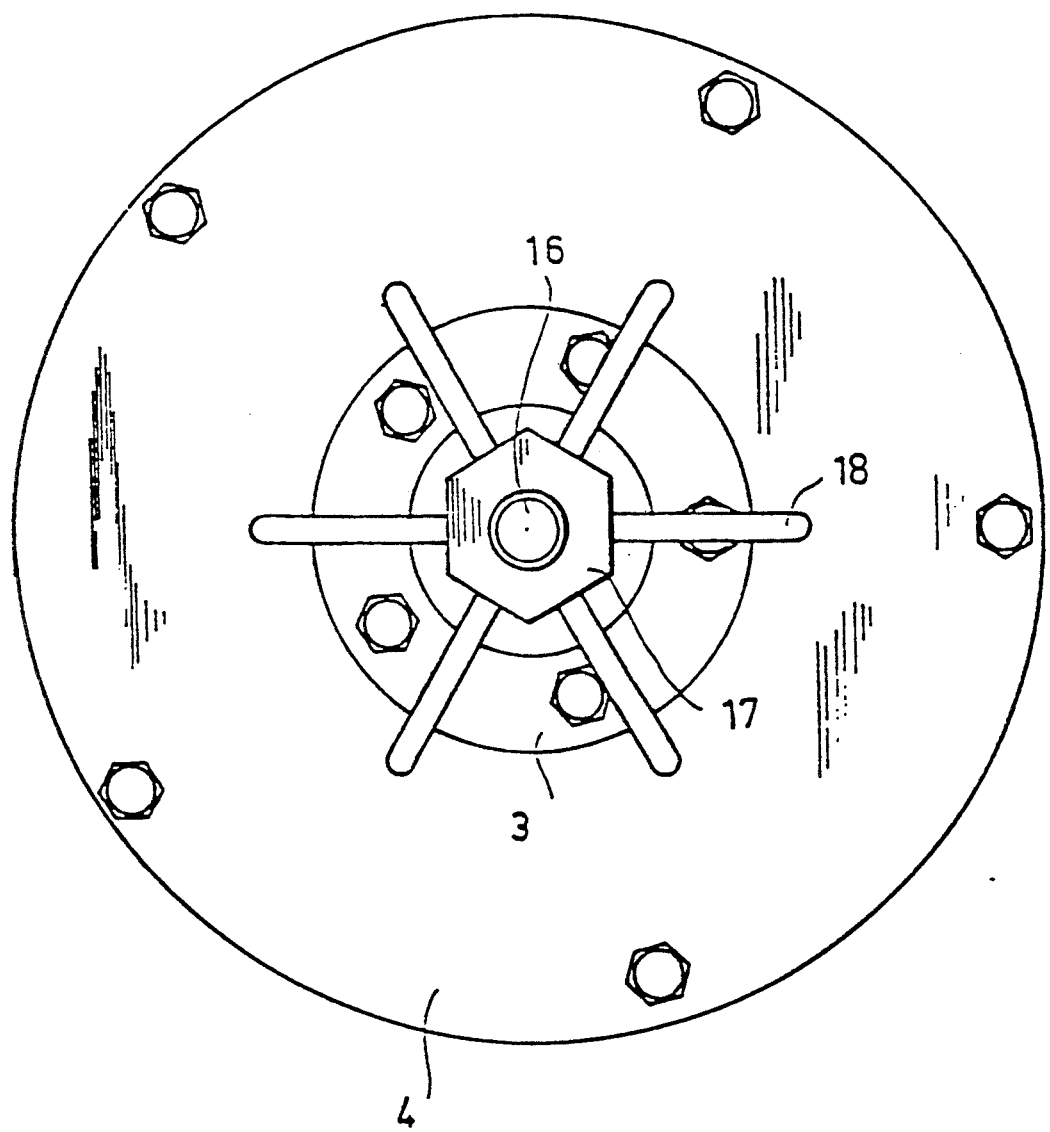
FIGS. 3 and 4 are respectively bottom and top views of the reactor.
Figure 4:
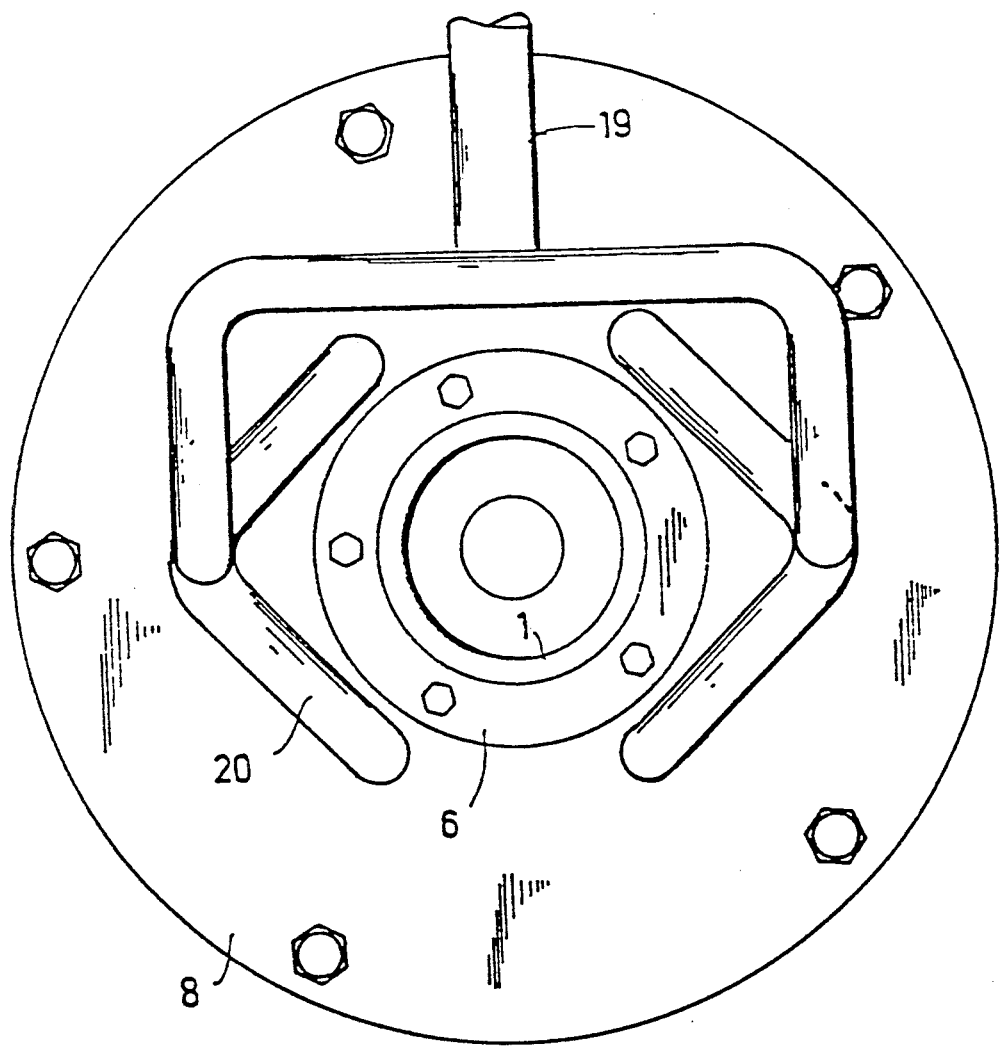
Figure 5:
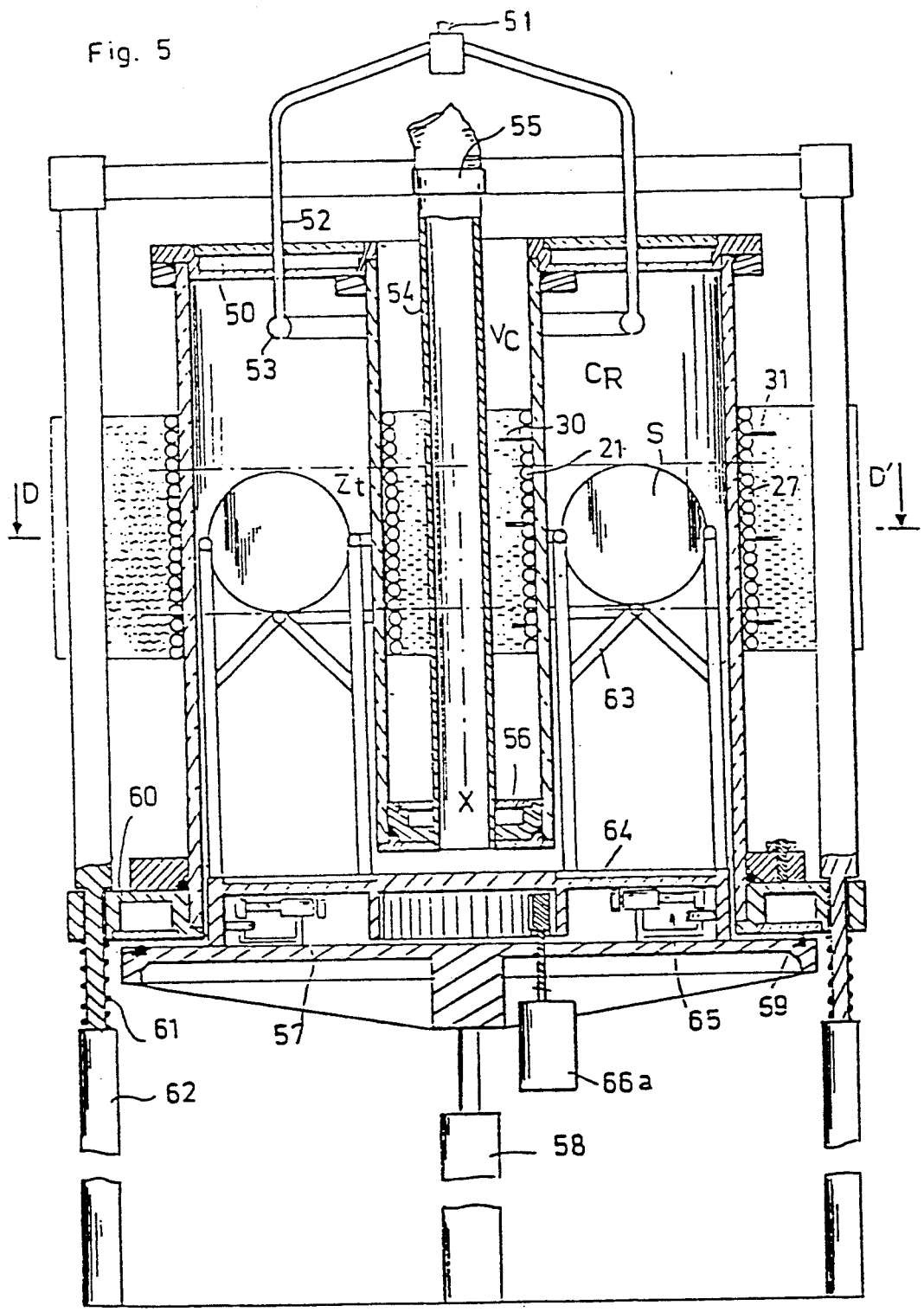
FIG. 5 is an axial cross-sectional view through a vertical plane CC' of another embodiment of the reactor.
Figure 6:
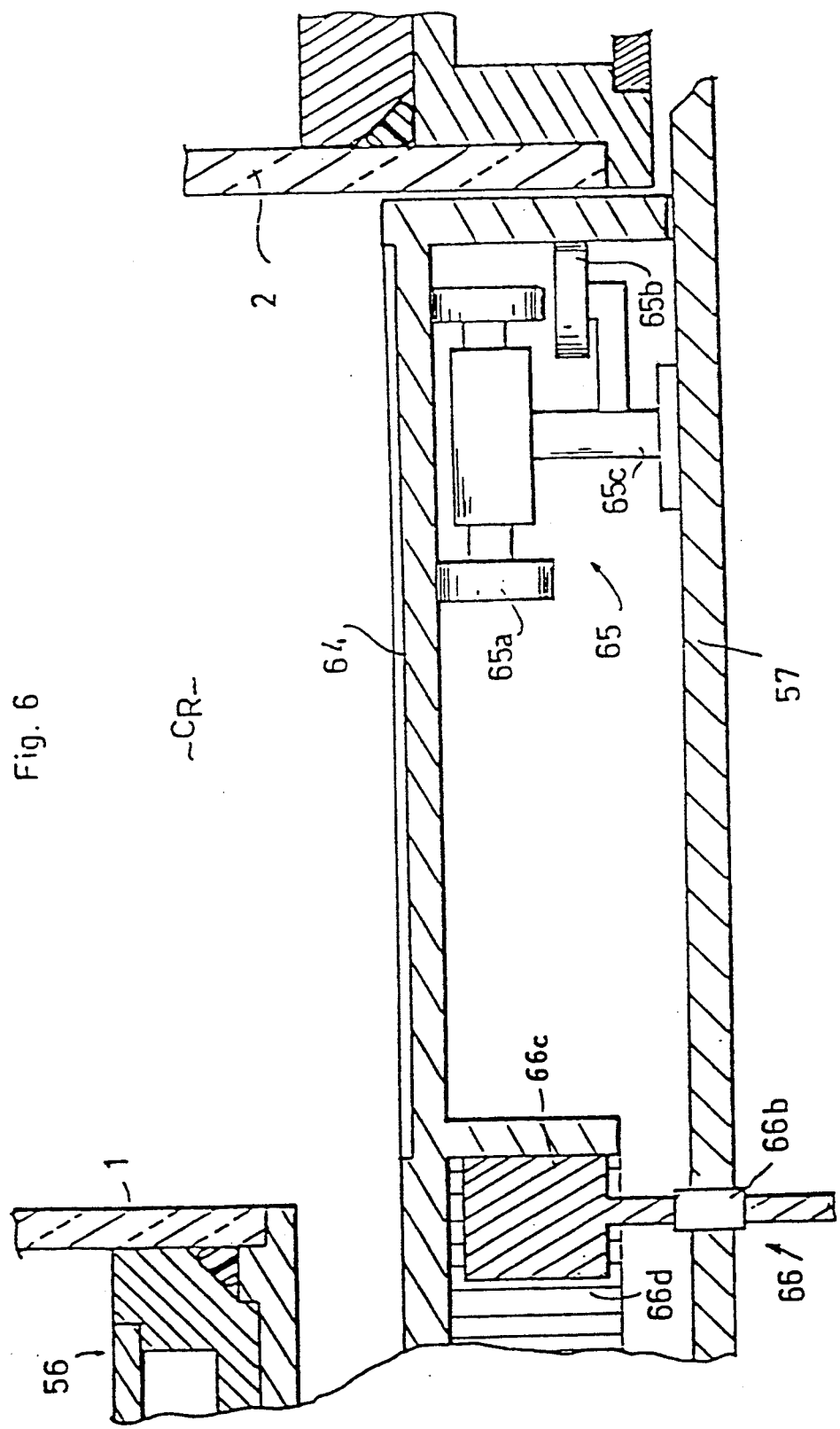
FIG. 6 is an axial cross-section of a detail of FIG. 5 on an enlarged scale.

The center plate of each boat is positioned in a radial, vertical plane as shown in FIG. 2, while the other plates of the same boat are situated in parallel vertical planes.

The gas flow, distributed over 360° at the base of the annular reaction chamber $C_R$ and withdrawn in the upper portion without particular disturbance of this distribution, contacts all of the plates simultaneously and in a homogeneous manner, which assures an excellent uniformity of treatment of all the plates regardless of their number. It should be noted that it is possible to arrange several superimposed layers of plates on an appropriate multi-stage support with a satisfactory result.

The homogeneous distribution of the flow and the precision of the temperature control are obtained in the same manner, regardless of the average radius of the annular reaction chamber $C_R$. Thus, the reactor of the invention may be dimensionally adapted to the number of substrates to be treated by a simple appropriate selection of this average radius which may vary from several tens of centimeters to several meters.

FIGS. 5, 6, 7 and 8 show another embodiment of the reactor. To facilitate understanding, the same reference numerals have been used for the same or similar members: cylindrical walls, inner 1 and outer 2, of quartz defining an annular reaction chamber $C_R$ and a central volume $V_C$, first heating assembly 21 in the central volume $V_C$, second heating assembly 27 around the outer wall 2, temperature sensors 30 and 31 . . . .

In this example, the means for distribution of the gas phase distributes the same through the upper closure wall 50 (which becomes the upstream wall), this wall being hollow to permit the circulation of a cooling fluid. As before, this distribution means comprises a general inlet conduit 51 connected to a network of distribution conduits 52 connected to the inlets which are arranged in the closure wall and distributed around the longitudinal axis to empty into the annular reaction chamber. In the example, a manifold 53 perforated on its periphery by a plurality of openings assures the distribution in the chamber $C_R$.

The aspiration means leaves the reactor from the side of the upstream wall 50 and comprises a pump collector 54 connected by a connection 55 to a flexible conduit connected to a vacuum pump. The collector 54 penetrates into the central volume $V_C$ from the side of the wall 50, and extends along the longitudinal, vertical axis X on the length of this volume. In the lower part, it passes through a sealed end member 56 closing the central volume $V_C$, for emptying opposite and above the downstream closure wall which will be described below. The end 56 is provided with a seal or gasket for assuring the sealing with the inner wall 1. This end member is preferably hollow to permit the circulation of a cooling fluid.

Thus, in this embodiment, the lower closure wall (downstream) is free from any distribution or pumping equipment. The gas phase is withdrawn in the lower part of the annular reaction chamber $C_R$ between the end 56 and the lower closure wall, from said chamber $C_R$ to the collector 54.

It should be noted that in a variation, it is also possible to reverse the distribution and aspiration, while keeping an extremity of the reactor free of any equipment: the distribution would then be assured by a distribution collector penetrating into the central volume from the side of the downstream closure wall and extending along said central volume for evacuating through an end member similar to the end 56. The gas phase is then distributed to the annular reaction chamber $C_R$ while flowing in a radially outward direction between said end and the closure wall. The evacuation itself is assured by a pump collector and suction conduits as before.

In the embodiment shown, the downstream closure wall 57 is movable and is carried by a cylinder 58 (or other means for reciprocal vertical movement) permitting moving it between a working position in which is closes the reactor and a loading position where it is separated therefrom.

In the working position, an 0-ring seal 59 comes to rest against an annular flange 60 in order to assure the sealing. A locking in this position may be provided in some cases.

The flange 60 (of a hollow shape in order to permit the circulation of the cooling fluid) cooperates with support springs such as 61 guided by support columns 62. The reactor is thus supported by these springs when the wall 57 is lowered to its loading position, while the compression of the seal 59 upon displacement toward the working position is carried out in a progressive and elastic manner, with the ability to control the compressive force.

Further, in the embodiment shown, the substrate support 63 is carried by the closure wall 57 through a rotating plate 64. The latter is mounted on means 65 for guiding in rotation comprising rollers such as 65b on a vertical axis against which rest a peripheral flange of the plate. Several guide assemblies of this type are distributed around the plate and secured by legs 65c to the wall 57. Drive means 66 comprises an electric motor 66a driving through a vertical shaft and a rotating joint 66b a pinion 66c in a ring gear 66d which is fixed to the plate 64.

Thus, the plates S to be coated which are arranged on the support 63 carried by the plate 64, may be caused to rotate about the vertical axis X of the reactor, either in the loading position in order to carry out the loading or unloading, or even in the working position on the interior of the annular reaction chamber.

Figure 7:
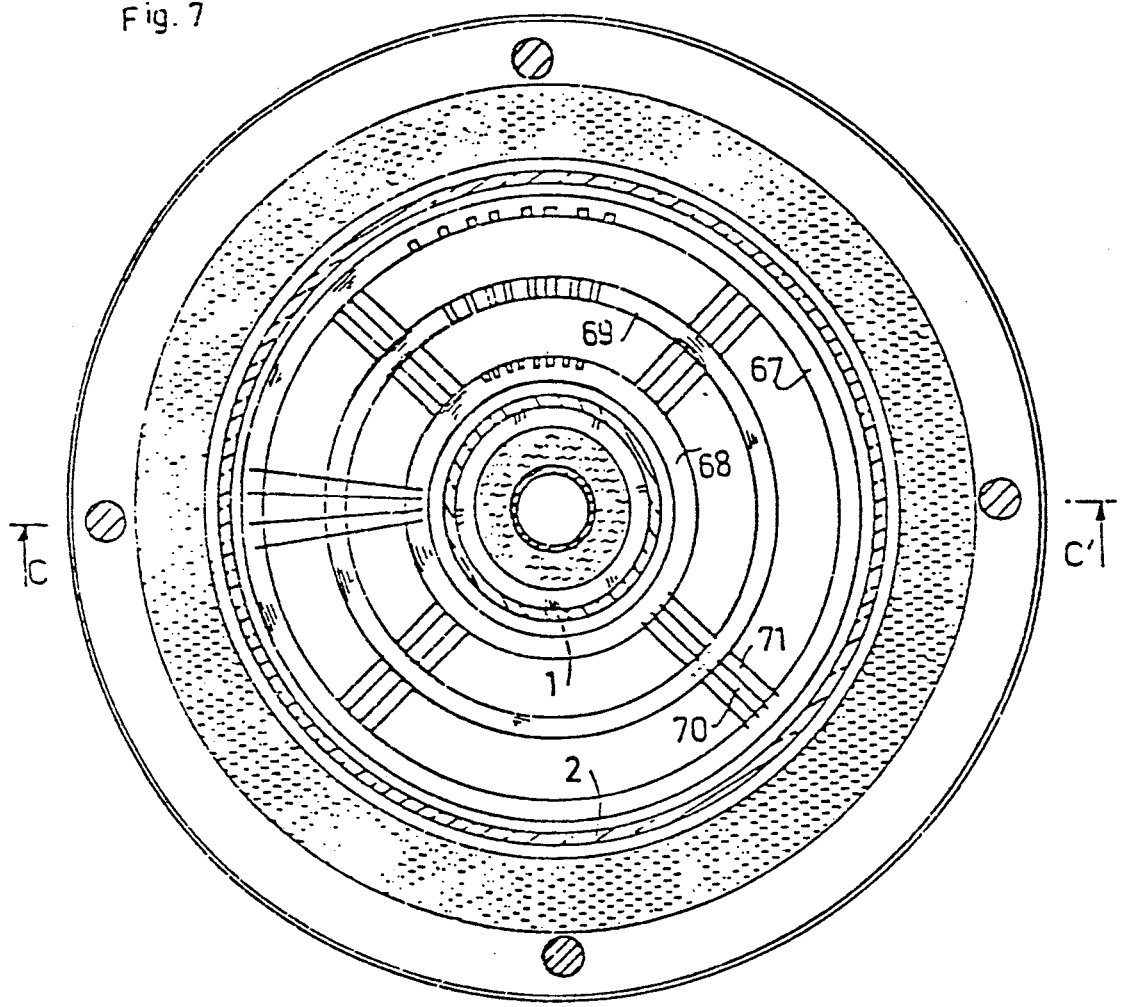
FIG. 7 is a transverse cross-sectional view through a horizontal plane DD' of said reactor.
Figure 8:
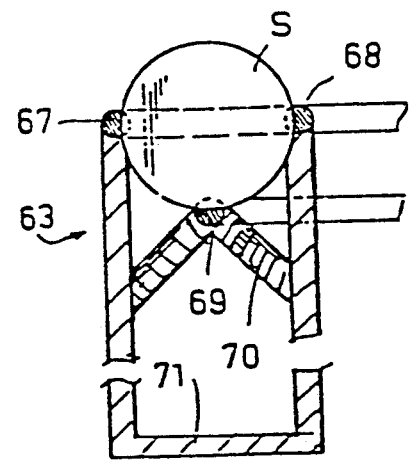
FIG. 8 is a partial cross-sectional detailed view of the substrate support equipping said reactor.

As shown in FIGS. 7 and 8, in the example the support 63 comprises three essentially horizontal, circular guides, two (67 and 68) at the same level (in the vicinity of the inner wall and the outer wall), the other 69 of intermediate radius at a lower level. These guides are connected by crossmembers 70 to the feet 71 resting on the plate 64.

The guides 67, 68 and 69 are provided with a plurality of notches on their periphery in order to permit the insertion therein of the plates S. Each plate is thus kept in a vertical, radial position by two lateral zones and one lower zone as shown in FIG. 8.

We claim:

1. A reactor for the deposition or treatment of a surface for coating or treating the surface of a plurality of substrates (S) comprising in combination:
   a first inner, sealed tubular wall (1) chemically stable at high temperature, and extending along a longitudinal axis (X) and defining internally a central volume ($V_C$),
   a second outer, sealed tubular wall (2) chemically stable at high temperature, extending about the first tubular wall for defining therewith an annular reaction chamber ($C_R$),
   two closure walls (4, 8; 50, 57) for sealingly closing said annular chamber ($C_R$) at its two longitudinal ends,
   a peripheral enclosure (26) extending around the outer tubular wall (2) over at least a portion of the height thereof,
   gas distribution means (16-18; 51-53) for delivering a gas phase to the interior of the annular reaction chamber ($C_R$) in the vicinity of one of the closure walls, said distribution means being arranged to distribute said gas phase over 360° in said annular chamber,
   aspiration means (19, 20; 54-56) arranged to evacuate the gas phase after reaction in the vicinity of the other closure wall, in such a manner as to maintain the distribution of a ring of flowing gas on the interior of the annular reaction chamber,
   said inner wall (1), said outer wall (2), said closure walls (4, 8; 50, 57), said gas distribution means (16-18; 51-53) and said aspiration means (19, 20; 54-56) being arranged such that said gas phase is present only in said reaction chamber ($C_R$) to the exclusion of the central volume ($V_C$) and the peripheral enclosure (26),
   a first heating assembly (21) arranged on the interior of the central volume ($V_C$) in such a manner as to be able to transmit toward the inner tubular wall (1) a heat flow distributed over 360°,
   a second heating assembly (27) arranged in the peripheral enclosure (26) in such a manner as to be able to transmit toward the outer tubular wall (2) a heat flow distributed over 360°,
   thermal control means adapted to control the first and second heating assemblies in such a manner that the calorific fluxes transmitted through the inner and outer walls tend to assure a predetermined longitudinal temperature profile over a working portion ($Z_t$) of the height thereof, and
   a substrate support (32, 63) of a shape adapted to be housed in the annular reaction chamber ($C_R$) and for positioning the substrates (S) in the working portion of said annular chamber.

2. A reactor as in claim 1, and wherein said
   gas distribution means comprises an inlet conduit (16) connected to a network of distribution conduits (18) arranged opposite the upstream closure wall (4), said network being connected to inlets (4a) provided in said upstream closure wall and distributed about the axis (X) for opening into the annular reaction chamber ($C_R$),
   said aspiration means comprises a collector pump (19) connected to a network of aspiration conduits (20) arranged opposite the downstream closure wall (8), said network being connected to outlets provided in said downstream closure wall and distributed about the axis (X) for evacuating the annular reaction chamber ($C_R$).

3. A reactor as in claim 1, and wherein said
   gas distribution means comprises an inlet conduit (51) connected to a network of distribution conduits (52) arranged opposite the upstream closure wall (50), said network being connected to inlets provided in said upstream closure wall and distributed about the axis (X) for opening into the annular reaction chamber ($C_R$),
   said aspiration means comprising a collector pump (54) penetrating into the central volume ($V_C$) of the side of the upstream closure wall (50) and extending therealong for evacuating through an end (56) closing said central volume, said end being arranged opposite the downstream closure wall (57) in such a manner that the gas phase may flow in the radially inward direction between this end and this wall, from the annular reaction chamber ($C_R$) toward the collector (54).

4. A reactor as in claim 1, and wherein said
   gas phase distribution means comprises a distribution collector penetrating into the central volume from the side of the downstream closure wall and extending therealong for opening through a closing end of said central volume, said end being arranged opposite the upstream closure wall in such a manner that the gas phase may flow in the radially outward direction between this end and this wall, from the collector toward the annular reaction chamber, said aspiration means comprises a collector pump connected to a network of aspiration conduits arranged opposite the downstream closure wall, said network being connected to outlets provided in said downstream closure wall and distributed about the axis for evacuating the annular reaction chamber.

5. A reactor as in claim 1, and wherein one of the closure walls (57) is movable and supported by translational moving means (58) adapted to permit displacing the wall between two positions, a working position where said wall sealingly closes the annular reaction chamber ($C_R$) at its longitudinal extremity, and a loading position wherein said wall is separated from said extremity for opening said chamber, said substrate support (63) being carried by said closure wall in such a manner as to be displaced therewith between a work position within said annular reaction chamber and an exterior loading position 6. A reactor as in claim 5, and wherein said the substrate support (63) is carried by the closure wall through a rotating plate (64), said plate being mounted on rotational guide means (65) and associated with means (66) for rotationally driving the same about the longitudinal axis (X).

7. A reactor as in claim 1, and wherein said the thermal control means comprises:
temperature sensors (30, 31) arranged on the internal surface of the inner tubular wall (1) and on the outer surface of the outer tubular wall (2),
a control unit for receiving the temperature information from the sendors and adapted to control the heating assemblies (21, 27) in such a manner as to reduce the variations between the detected temperatures and the intended temperatures, corresponding to the desired temperature profile.

8. A reactor as in claim 7, and wherein said heating assemblies are electrical, characterized in that:
each heating assembly (21, 27) is divided into a plurality of sub-assemblies (21a-21c; 27a-27c) separately controlled and longitudinally juxtaposed,
the temperature sensors (30a-30c; 31a-31c) are positioned at the level of the various heating sub-assemblies,
the control unit is adapted to control each heating sub-assembly as a function of the temperature information from the one or more corresponding sensors in such a manner for each sub-assembly as to reduce the variation between the detected temperature and a desired temperature for said sub-assembly.

9. A reactor as in claim 8 permitting provision of an essentially homogeneous temperature in the work portion ($Z_t$) of the annular reaction chamber, and wherein
each heating assembly (21, 27) is divided into three juxtaposed sub-assemblies, an intermediate sub-assembly (21a, 27a) situated at the level of the work portion ($Z_t$), and the other two marginal (21b,c; 27b,c) situated on opposite sides thereof,
the control unit being adapted to increase the heat flow furnished by each heating sub-assembly in case of a negative variation between the temperature sensed at the level of the sub-assembly and an identical directed temperature for all the sub-assemblies, and for reducing the heat flow in the opposite case.

10. A reactor as in claim 1, for treating a plurality of substrates each comprising a plate (S) of slight thickness with respect to its other dimensions, in which the substrate support (32, 63) has a generally annular shape and defines on its periphery a plurality of lodgings, each adapted to maintain a plate (S) is a radial position or adjacent to the radial position.

11. A reactor as in claim 10, for operation with its axis (X) essentially vertical, and wherein said substrate support (63) comprises essentially horizontal circular guides (67-69), connected by cross-members (70) to feet (71), said circular guides being provided with notches on their periphery arranged to be able to keep each plate (S) in a radial, vertical position by lateral and bottom edges thereof.

12. A reactor as in claim 10 for operation with its axis (X) essentially vertical, the plates (S) being prepositioned by lots on boats (N) where they are arranged in parallel planes, and wherein said substrate support (32) comprises an annular, perforated frame (32b 32c) provided with means (32a) for positionning a plurality of boats on its periphery, said positionning means being adapted to arrange each boat such that the central plate thereof is in a vertical, radial position in the annular reaction chamber ($C_R$).

13. The application of a reactor as in one of the preceding claims, for the production of a vapor phase deposition on the substrates.

14. A reactor as in claim 1 for carrying out a chemical vapor phase deposition of conducting, semi-conducting or insulating films for the production of electronic circuits or components, and wherein said inner tubular wall (1) and the outer tubular wall (2) are cylindrical walls of a refractory material of high thermal stability, supported by annular flanges (3, 6, 7, 9, 10, 12, 13) at their longitudinal extremities, the substrate support (32, 63) being itself made of a refractory material of high thermal stability.

15. A reactor as in claim 14 in which the inner (1) and outer (2) tubular walls as well as the substrate support are made of quartz.

* * * * *